US012794467B2

(12) United States Patent
Bellaouar et al.

(10) Patent No.: US 12,794,467 B2
(45) Date of Patent: Nov. 10, 2026

(54) CAPACITIVE ELEMENT AND CIRCUIT STRUCTURE INCLUDING CAPACITIVE ELEMENT(S)

(71) Applicant: GlobalFoundries U.S. Inc., Malta, NY (US)

(72) Inventors: Abdellatif Bellaouar, Richardson, TX (US); Arul Balasubramaniyan, Plano, TX (US)

(73) Assignee: GLOBALFOUNDRIES U.S. INC., Malta, NY (US)

(*) Notice: Subject to any disclaimer, the term of this patent is extended or adjusted under 35 U.S.C. 154(b) by 135 days.

(21) Appl. No.: 18/804,603

(22) Filed: Aug. 14, 2024

(65) Prior Publication Data

US 2026/0051888 A1 Feb. 19, 2026

(51) Int. Cl.
*H03K 17/687* (2006.01)
*H10D 86/00* (2025.01)

(52) U.S. Cl.
CPC ....... *H03K 17/6871* (2013.01); *H10D 86/201* (2025.01)

(58) Field of Classification Search
CPC ..... H03K 17/6871; H10D 86/201; H03J 5/02; H03B 2201/0208; H03B 2201/0266
See application file for complete search history.

(56) References Cited

U.S. PATENT DOCUMENTS 7,245,519 B2 7/2007 McQuirk et al.
11,290,087 B2 3/2022 Ranta
2007/0247237 A1 10/2007 Mohammadi
2014/0184363 A1 7/2014 Jou et al.
2018/0026580 A1 1/2018 Zhang et al.
2019/0296751 A1* 9/2019 Zhang .................. H03B 5/1212

FOREIGN PATENT DOCUMENTS

JP H089257 A * 1/1996

OTHER PUBLICATIONS

Ferriss et al., "A 12-to-26GHz Fractional-N PLL with Dual Continuous Tuning LC-D/VCOs," ISSCC Feb. 2, 2016, Session 10, Advanced Wireline Transceivers and PLLs, 10.8, 4 pages.
European Search Report for corresponding EP Application No. 25158716.8-1001 dated Jul. 29, 2025, 7 pages.
Zhang et al., "A Wide Range 60 GHz VCO Using Back-Gate Controlled Varactor in 22 nm FDSOI Technology," IEEE 2017, downloaded from IEEE Xplore on May 28, 2022, 3 pages.

* cited by examiner

*Primary Examiner* — Metasebia T Retebo
(74) *Attorney, Agent, or Firm* — Ramakrishnan Parthasarathy Hoffman Warnick LLC

(57) ABSTRACT

Disclosed are a capacitive element (CE) and a circuit structure including CE(s). The CE includes series-connected first, second, and third transistors (dual-gate n-type field effect transistors). Shared source/drain regions between the second and first transistors and between the first and third transistors are connected to capacitors, respectively. The first transistor is larger than the second and third transistors. The front gate of the first transistor and back gates of all three transistors receive a first control voltage (VC1). The front gates of the second and third transistors receive a second control voltage (VC2). VC1 and VC2 are concurrently switchable to concurrently switch the three transistors between on and off states. High and low voltage levels of VC1 are at a first positive voltage level and at ground. High and low voltage levels of VC2 are at the first positive voltage level and at a second positive voltage level.

20 Claims, 8 Drawing Sheets

| **State** | **VC1** | **VC2** | Comment |
|---|---|---|---|
| On-State<br>(High Cap) | VH<br>(e.g., 0.9V) | VH<br>(e.g., 0.9V) | All NFETs are on for low on-resistance (Ron) |
| Off-State<br>(Low Cap) | VL1<br>(e.g., 0.0V) | *VL2 | NFET 110 is completely off but NFETs 120 and 130 are biased in the sub-threshold region to provide high off-resistance (Roff) impedance |

*See circuit of FIG. 4.2 for VL2 generation

FIG. 4

| | Con (fF) | Coff (fF) | Tuning Ratio (i.e. Con/Coff) | Qon | Qoff |
|---|---|---|---|---|---|
| Prior Art CE | 13.5 | 4.2 | 3.2 | 11 | 252 |
| CE 101 of FIG. 2A | 12.4 | 2.6 | 4.8 | 13 | 88 |
| CE 101' of FIG. 3 | 12.5 | 2.3 | 5.6 | 12.6 | 75.2 |

FIG. 5

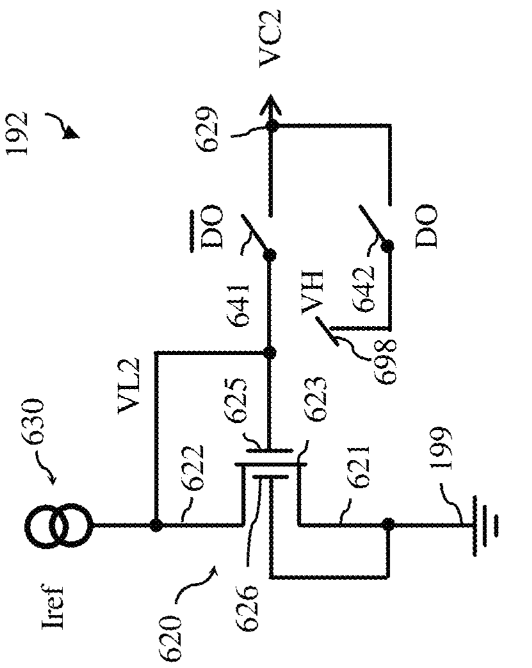
FIG. 6.2
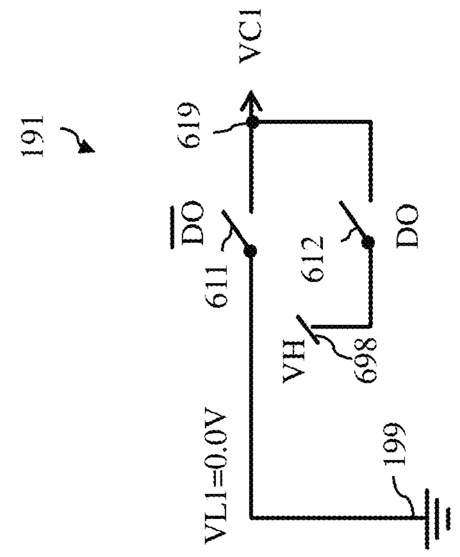
FIG. 6.1

CAPACITIVE ELEMENT AND CIRCUIT STRUCTURE INCLUDING CAPACITIVE ELEMENT(S)

BACKGROUND

The present disclosure relates to capacitors and, more particularly, to embodiments of a capacitive element (CE) and to embodiments of circuit structure (e.g., a compact digitally tunable capacitor structure) including one or more CEs.

Goals of modern integrated circuit design include, but are not limited to, improving performance, size scaling, and reducing power consumption. Oftentimes design changes with respect to one of these goals can result in an undesirable trade-off with respect to one or more of the other goals. For example, currently available digitally tunable capacitors typically consume a relatively large amount of chip area and have either: (1) a large tuning range with a low on-state quality factor (Q) so they consume a relatively high amount of power; or (2) a small tuning range with a high on-state Q so they consume a relatively low amount of power. That is, there is essentially a trade-off between the size of the tuning range and the on-state Q.

SUMMARY

Disclosed herein are embodiments of a capacitive element (CE). Also disclosed herein are embodiments of a circuit structure (e.g., a compact digitally tunable capacitor) including one or more CEs.

More specifically, disclosed herein are embodiments of a CE structure. The CE structure can include three transistors. These three transistors can include: a first transistor with a first front gate and a first back gate; a second transistor with a second front gate and a second back gate; and a third transistor with a third front gate and a third back gate. The first transistor can be connected in series between the second transistor and the third transistor. The first front gate, the first back gate, the second back gate, and the third back gate can be connected to receive a first control voltage, whereas the second front gate and the third front gate can be connected to receive a second control voltage. The CE can also include a pair of capacitors. The capacitors can include: a first capacitor, which is connected to a first shared source/drain region between the first transistor and the second transistor; and a second capacitor, which is connected to a second shared source/drain region between the first transistor and the third transistor.

Disclosed herein are also embodiments of a circuit structure (e.g., a compact digitally tunable capacitor) that includes one or more CE structures. Specifically, this circuit structure can include: a first voltage line, a second voltage line, and at least one CE connected between the first voltage line and the second voltage line. The CE can include three transistors. The three transistors can include: a first transistor with a first front gate and a first back gate; a second transistor with a second front gate and a second back gate; and a third transistor with a third front gate and a third back gate. The first transistor can be connected in series between the second transistor and the third transistor. The second transistor can be connected between a ground rail and the first transistor and the third transistor can be connected between the first transistor and the ground rail. The first front gate, the first back gate, the second back gate, and the third back gate can be connected to receive a first control voltage, whereas the second front gate and the third front gate can be connected to receive a second control voltage. The CE can also include a pair of capacitors. The capacitors can include: a first capacitor, which is connected between the first voltage line and a first shared source/drain region between the first transistor and the second transistor; and a second capacitor, which is connected between the second voltage line and a second shared source/drain region between the first transistor and the third transistor.

In some embodiments, the disclosed circuit structure (e.g., the disclosed compact digitally tunable capacitor) can include a first voltage line, a second voltage line, and multiple CEs, which are connected in parallel between the first voltage line and the second voltage line. Each CE can include three transistors. The three transistors can include: a first transistor with a first front gate and a first back gate; a second transistor with a second front gate and a second back gate; and a third transistor with a third front gate and a third back gate. The first transistor can be connected in series between the second transistor and the third transistor. The second transistor can be connected between a ground rail and the first transistor and the third transistor can be connected between the first transistor and the ground rail. The first front gate, the first back gate, the second back gate, and the third back gate can be connected to receive a first control voltage, whereas the second front gate and the third front gate can be connected to receive a second control voltage. The CE can also include a pair of capacitors. The capacitors can include: a first capacitor, which is connected between the first voltage line and a first shared source/drain region between the first transistor and the second transistor; and a second capacitor, which is connected between the second voltage line and a second shared source/drain region between the first transistor and the third transistor.

It should be noted that all aspects, examples, and features of disclosed embodiments mentioned in the summary above can be combined in any technically possible way. That is, two or more aspects of any of the disclosed embodiments, including those described in this summary section, may be combined to form implementations not specifically described herein. The details of one or more implementations are set forth in the accompanying drawings and the description below. Other features, objects and advantages will be apparent from the description and drawings, and from the claims.

BRIEF DESCRIPTION OF THE DRAWINGS

The present disclosure will be better understood from the following detailed description with reference to the drawings, which are not necessarily drawn to scale and in which:

FIG. 4 is a table illustrating examples of the high and low voltage levels that could be employed for VC1 and VC2;

FIG. 5 is a table illustrating examples of various performance values including on-state capacitance (Con), off-state capacitance (Coff), tuning ratio, on-state Q (Qon), and off state Q (Qoff), which could be achieved with the disclosed CE embodiments;

FIG. 6.1 is a schematic diagram illustrating an example of a first voltage supply that could be incorporated into the circuit structure of FIG. 1;

FIG. 6.2 is a schematic diagram illustrating an example of a second voltage supply that could be incorporated into the circuit structure of FIG. 1.

DETAILED DESCRIPTION

As mentioned above, goals of modern integrated circuit design include, but are not limited to, improving performance, size scaling, and reducing power consumption. Oftentimes design changes with respect to one of these goals can result in an undesirable trade-off with respect to one or more of the other goals. For example, currently available digitally tunable capacitors typically consume a relatively large amount of chip area and have either: (1) a large tuning range with a low on-state quality factor (Q) so they consume a relatively high amount of power; or (2) a small tuning range with a high on-state Q so they consume a relatively low amount of power. That is, there is essentially a trade-off between the size of the tuning range and the on-state Q. Those skilled in the art will recognize that Q represents the efficiency of a given capacitor in terms of energy losses. More particularly, Q can be defined as:

$$Q = \frac{X}{R} = \frac{1}{\omega_0 CR},$$

where X represents the reactance of the capacitor, R represents the series resistance of the capacitor, C represents the capacitance of the capacitor, and do represents the frequency in radians at which the measurement is taken.

Figure 7:
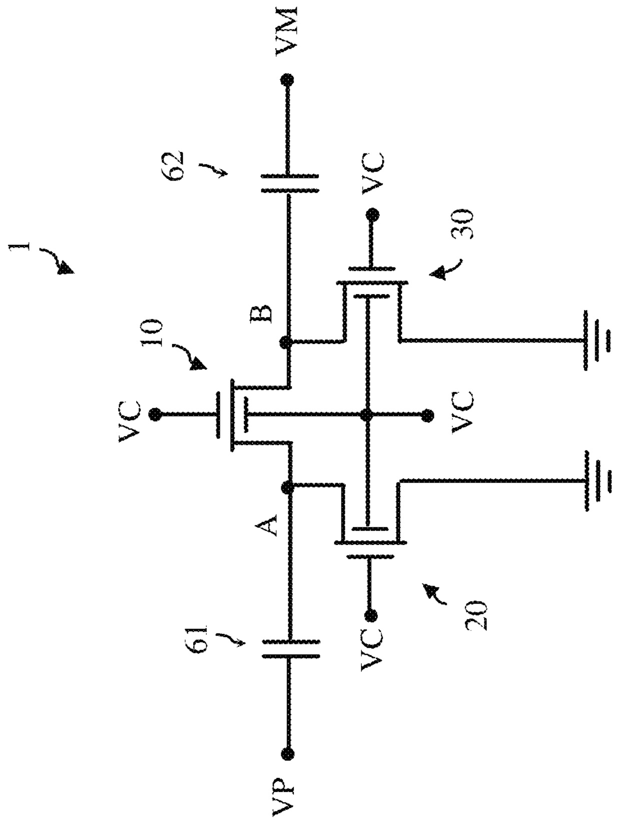
FIG. 7 (PRIOR ART)
FIG. 7 is a schematic diagram illustrating a conventional CE.

FIG. 7 is a schematic diagram illustrating an example of a capacitive element 1 that could be employed in a digitally tunable capacitor. This capacitive element 1 includes a first capacitor 61, a first N-type field effect transistor (NFET) 10, and a second capacitor 62 connected in series between voltage lines VP and VM. It further includes second and third NFETs 20 and 30 connected in series between source/drain regions of the first NFET 10, respectively, and ground. Gates and body regions of the three NFETs 10, 20, and 30 are tied to the same control voltage (VC). For the highest on-state Q, first NFET 10 has a relatively short channel length to achieve a low resistance (Ron) when VC goes high, thereby turning on the NFETs. However, second NFET 20 and third NFET 30 must have relatively long channel lengths (thereby increasing chip area) to provide a high off resistance (Roff) when VC goes low. Depending on process corners and temperature, this Roff can be in the giga-ohms range. In the off-state, nodes A and B will be floating. However, the separate NFETS 20 and 30 add additional parasitic capacitance that reduces the tuning range. Ideally, the tuning range needs to be increased without reducing either on-state or off-state Q.

In view of the foregoing, disclosed herein are embodiments of a capacitive element (CE). CE can include three transistors (i.e., a first transistor, a second transistor, and a third transistor) with a shared active device region and a pair of capacitors (i.e., a first capacitor and a second capacitor). The second transistor can be connected between a ground rail and the first transistor and the third transistor can be connected between the first transistor and the ground rail. A first shared source/drain region between the second and first transistors can be connected to a first capacitor, whereas a second shared source/drain region between the first and third transistors can be connected to a second capacitor. The three transistors can be n-type field effect transistors (NFETs) with the first transistor being larger than the second and third transistors (e.g., the first transistor can have more gate fingers and, thus, a larger total channel width than the second and third transistors). The three transistors can be dual-gate (i.e., can each have front and back gates). For example, the three transistors can be formed using an advanced semiconductor-on-insulator processing technology with device regions within a continuous portion of a semiconductor layer (referred to herein as an active device region) and with back gates sharing a well region in a semiconductor substrate below an insulator layer. In any case, the front gate of the first transistor and the back gates of all three transistors can receive a first control voltage (VC1), whereas the front gates of the second and third transistors can receive a second control voltage (VC2). VC1 and VC2 can be concurrently switchable between high and low voltage levels to concurrently switch the three transistors between on and off states. The high and low voltage levels of VC1 can be at a first positive voltage level (which is higher than threshold voltages of the three transistors) and at ground (e.g., 0.0 volts (V)), whereas the high and low voltage levels of VC2 can be at the first positive voltage level and at a second positive voltage level, which is lower than the first positive voltage level but higher than 0.0V (e.g., at or close to the threshold voltages of the three transistors). Also disclosed herein are embodiments of compact digitally tunable capacitor including an array of such CEs.

Figure 1:
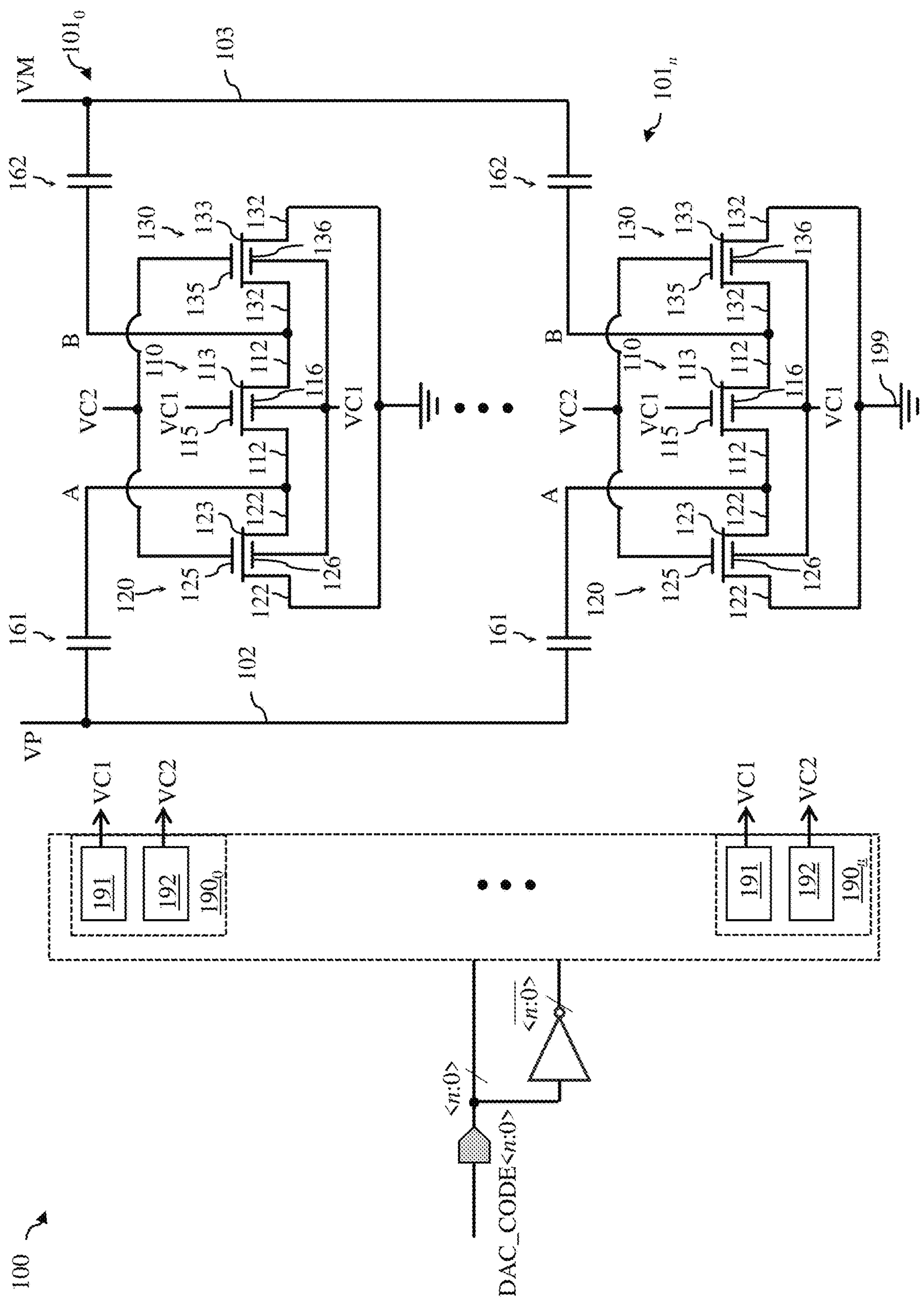
FIG. 1 is a schematic diagram illustrating disclosed embodiments of a capacitive element (CE) and further illustrating disclosed embodiments of a circuit structure (e.g., a digitally tunable capacitor) including multiple CEs.

More particularly, FIG. 1 is a schematic diagram illustrating disclosed embodiments of a CE (e.g., see CEs 101$_{0-n}$) and further illustrating disclosed embodiments of a circuit structure 100 (e.g., a compact digitally tunable capacitor (TC), hereinafter referred to as TC 100) that includes multiple CEs 101$_0$-101$_n$.

As illustrated, TC 100 can include parallel voltage lines and, particularly, a first voltage line 102 and a second voltage line 103 (also referred to herein as a positive voltage (VP) line and a negative voltage (VM) line or differential voltage lines). TC 100 can further include one or more CEs (e.g., see CEs 101$_{0-n}$) connected in parallel between the first and second voltage lines 102-103. Each CE 101$_{0-n}$ can be individually programmed (i.e., digitally controlled), as discussed in greater detail below, so as to be in either an off-state with a relatively low off-state capacitance (Coff) or an on-state with a relatively high on-state capacitance (Con). By selectively programming one or more of the CEs 101$_{0-n}$ to be in the on-state, the total capacitance (Ctotal) provided by TC 100 can be selectively adjusted (i.e., tuned). Those skilled in the art will recognize that Ctotal will be equal to the sum of the capacitances (on-state or off-state) of CEs 101$_{0-n}$.

Each CE 101$_{0-n}$ can include three transistors and, particularly, three N-type field effect transistors (NFETs). That is, each CE 101$_{0-n}$ can include a first transistor 110 (also referred to herein as first NFET 110), a second transistor 120 (also referred to herein as second NFET 110), and a third transistor 130 (also referred to herein as third NFET 130). These transistors can be series-connected and can share a defined active device region in a semiconductor layer. Specifically, second NFET 120 can be series connected between a ground rail 199 (e.g., at 0.0V) and first NFET 110 and third NFET 130 can be series-connected between the first NFET 110 and ground rail 199. The three transistors can all be dual-gate NFETs. That is, each transistor can include, amongst other components as discussed in greater detail below, a front gate and a back gate opposite the front gate. Furthermore, first NFET 110 can be larger than second NFET 120 and third NFET 130 and, particularly, can have a larger total channel width than second NFET 120 and third NFET 130. For example, all three transistors can be formed from an essentially rectangular shaped active device region, which has been patterned from a semiconductor layer. The front gate of first NFET 110 can have multiple front gate fingers that traverse the active device region, whereas the front gates of second NFET 120 and third NFET 130 can each have a lesser number of front gate fingers than the first NFET 110. For example, the second NFET 120 and third NFET 130 can each have a single front gate finger or fewer front gate fingers than first NFET 110. All front gate fingers of all three transistors can have equal dimensions. However, those skilled in the art will recognize that, due to the greater number of gate fingers in first NFET 110 as compared to the number(s) of gate fingers in second NFET 120 and third NFET 130, first NFET 110 has larger total channel width than second NFET 120 and third NFET 130.

Figure 2A:
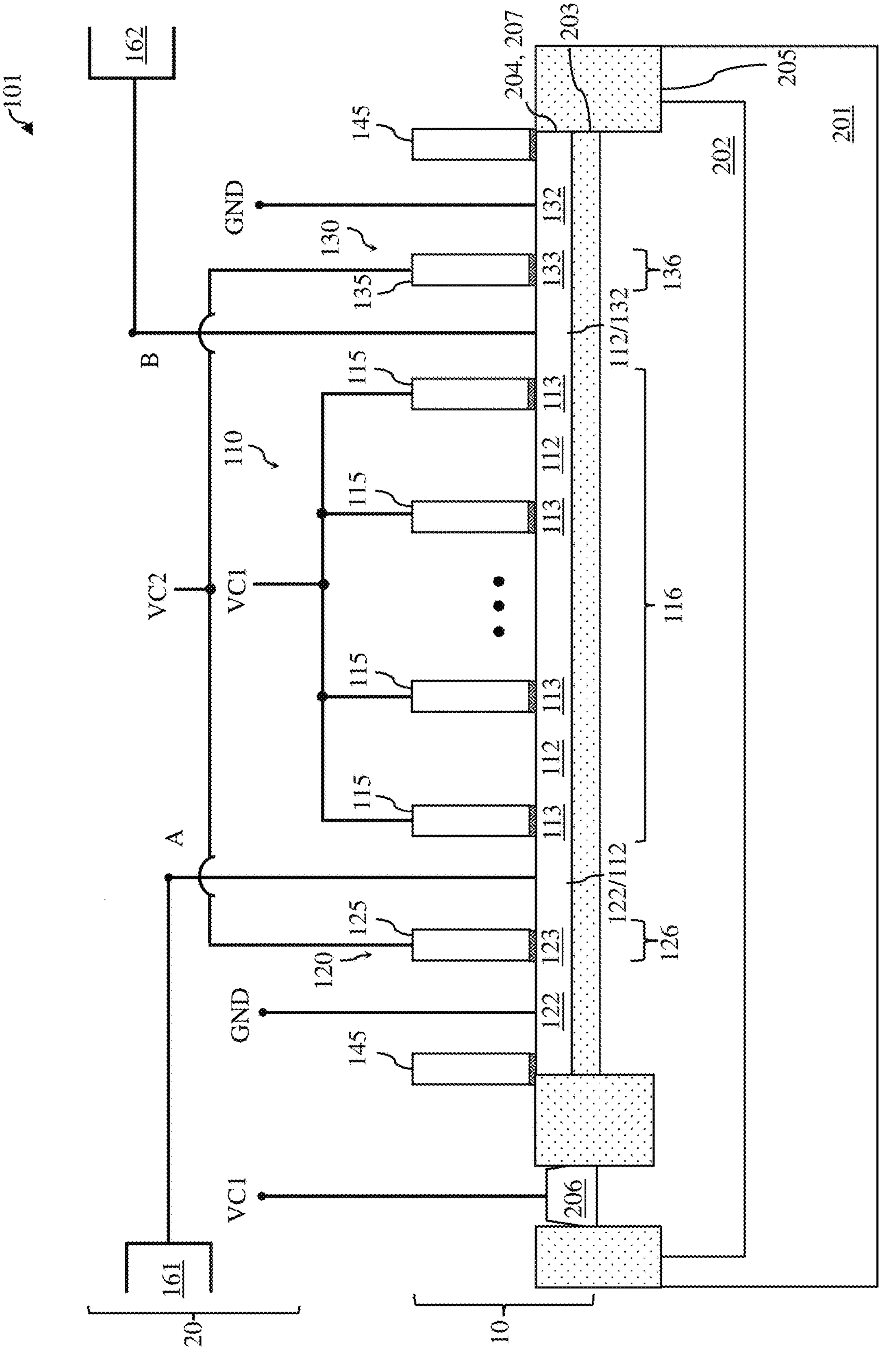
FIGS. 2A and 2B are cross-section and top view layout diagrams, respectively, illustrating, in greater detail, one embodiment of the CE of FIG. 1.
Figure 2B:
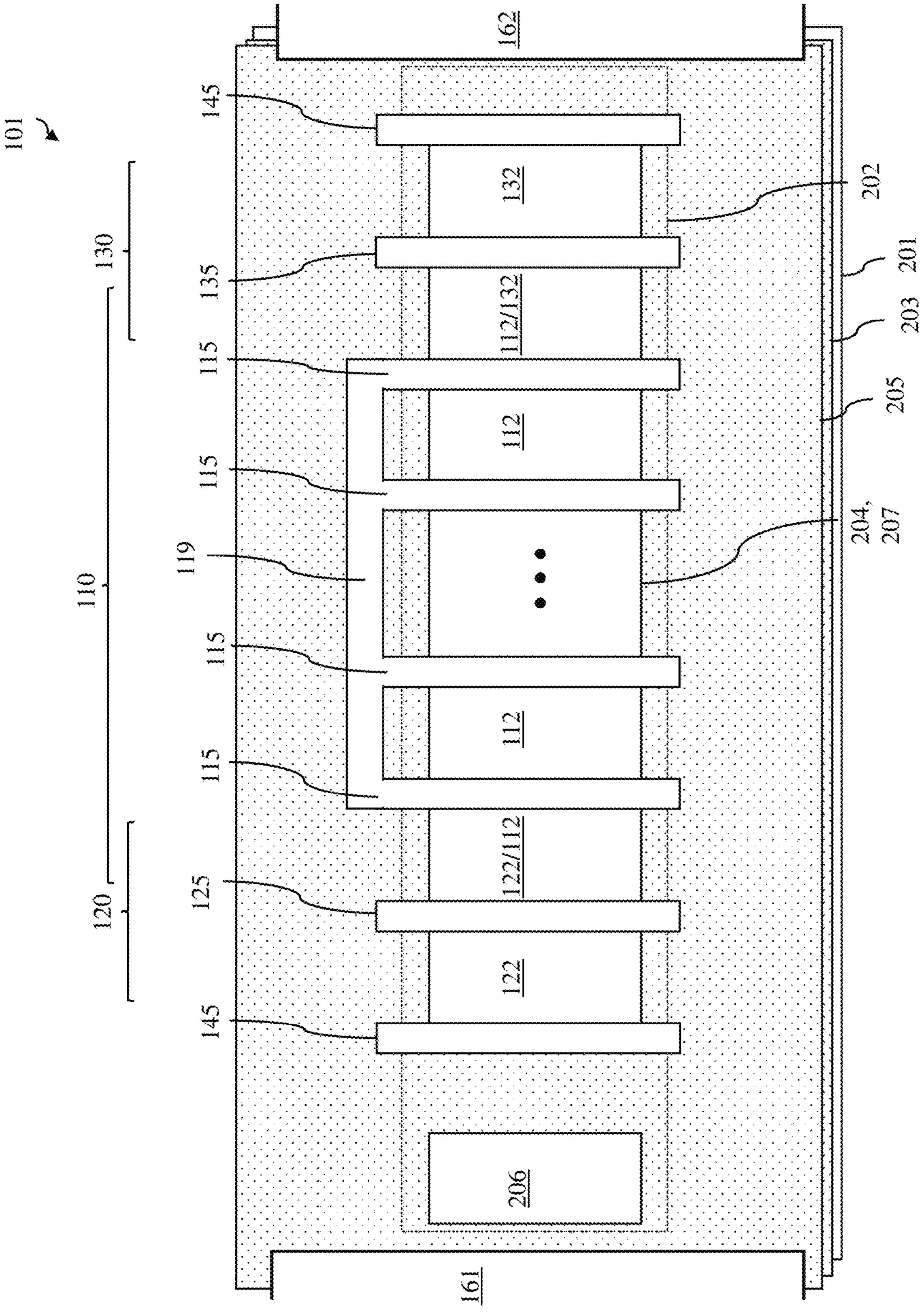

More specifically, FIGS. 2A and 2B are cross-section and top view layout diagrams, respectively, illustrating one example of a CE 101 that could be incorporated into TC 100. In this example, first NFET 110, second NFET 120, and third NFET 130 are formed using an advanced semiconductor-on-insulator technology processing platform. That is, first NFET 110, second NFET 120, and third NFET 130 are semiconductor-on-insulator NFETs (e.g., silicon-on-insulator (SOI) NFETs), such as either fully-depleted semiconductor-on-insulator NFETs (e.g., a fully-depleted SOI (FDSOI) NFETs) or partially-depleted semiconductor-on-insulator NFETs (e.g., a partially-depleted SOI (PDSOI) NFETs).

As illustrated in FIGS. 2A and 2B in combination, CE 101 (along with all other CEs of TC 100) can be formed on a semiconductor substrate 201. Semiconductor substrate 201 can be, for example, a monocrystalline silicon substrate or, alternatively, a monocrystalline substrate of any other suitable semiconductor material (e.g., silicon germanium, etc.). An insulator layer 203 can be on the top surface of semiconductor substrate 201. Insulator layer 203 can be, for example, a silicon dioxide layer or a layer of any other suitable insulator material. A semiconductor layer 204 can be on the top surface of insulator layer 203. Semiconductor layer 204 can be, for example, a monocrystalline silicon layer or a layer of any other suitable monocrystalline semiconductor material (e.g., silicon germanium, etc.).

Trench isolation regions 205 (e.g., shallow trench isolation (STI) structures) can define a continuous portion of semiconductor layer 204 (referred to herein as an active device region 207) that includes the device regions for the three transistors 110-130 of CE 101. Such STI structures can include, for example, one or more trenches patterned (e.g., lithographically) and etched so as to extend vertically from the top surface of semiconductor layer 204 to (and optionally through) insulator layer 203 and so as to define the shape of (i.e., laterally surround) active device region 207. In some embodiments, the defined shape of the active device region 207 can be essentially rectangular in shape (when viewed from the top down, as illustrated in FIG. 2B). The trench(es) can be filled with one or more layers of isolation materials (e.g., silicon dioxide, silicon nitride, silicon oxynitride, etc.), thereby forming the STI structures.

First NFET 110 can be positioned laterally between second NFET 120 and third NFET 130. First NFET 110 can include a first front gate with multiple first front gate fingers 115. The first front gate fingers 115 can be parallel, can be physically separated from each other, and can traverse active device region 207 so as to be adjacent to (e.g., above, and immediately adjacent to) corresponding first channel regions 113 for first NFET 110 within a center portion of active device region 207. First front gate fingers 115 can be electrically connected, as discussed in greater detail below. In any case, each first channel region 113 within active device region 207 can be positioned laterally between first source/drain regions 112.

Second NFET 120 can include a second front gate with one or more second front gate fingers 125. The second front gate finger(s) 125 can traverse active device region 207 and, more specifically, can be adjacent to (e.g., above, and immediately adjacent to) corresponding second channel region(s) 123 for second NFET 120 within one end of active device region 207. It should be understood that if second NFET 120 has more than one second front gate finger 125, these second front gate fingers can be parallel to each other and electrically connected. Each second channel region 123 can be positioned laterally between second source/drain regions 122. As illustrated, the portion of semiconductor layer 204 extending between a second front gate finger 125 and a first front gate finger 115 can be shared by a second source/drain region 122 and a first source/drain region 112 and is referred to herein as a first shared source/drain region 122/112.

Third NFET 130 can include a third front gate with one or more third front gate fingers 135. The third front gate finger(s) 135 can traverse active device region 207 and, more specifically, can be adjacent to (e.g., above, and immediately adjacent to) corresponding third channel region (s) 133 for third NFET 130 in an opposite end of active device region 207. Each third channel region 133 can be positioned laterally between third source/drain regions 132. It should be understood that if third NFET 130 has more than one third front gate finger 135, these third front gate fingers can be parallel to each other and electrically connected. As illustrated, the portion of semiconductor layer 204 extending between a first front gate finger 115 and a third front gate finger 135 can be shared by a first source/drain region 112 and a third source/drain region 132 and is referred to herein as a second shared source/drain region 112/132.

For purposes of illustration, second NFET 120 and third NFET 130 are each illustrated as having only a single front gate finger. It should be understood that these two NFETs 120, 130 could, alternatively, have multiple front gate fingers as long as the number of second and third front gate fingers is the same (so the CE is symmetric) and as long as the number is less than the total number of first front gate fingers 115. Optionally, dummy gate fingers 145 can be at opposite ends of the structure and not electrically connected to the gate fingers of NFETs 110, 120, or 130.

In any case, the front gate fingers (including first front gate fingers 115, second front gate finger(s) 125, third front gate finger(s) 135, and any dummy front gate fingers 145) can have the same multi-layered configuration. For example, each front gate finger can include a gate dielectric layer (including one or more layers of gate dielectric material) immediately adjacent to a channel region within semiconductor layer 204 and a gate conductor layer (including one or more layers of gate conductor material) on the gate dielectric layer. Each front gate finger can be any of a gate-first polysilicon gate structure, a gate-first high-K metal gate (HKMG) structure, a gate-last HKMG structure (also referred to as a replacement metal gate (RMG) structure), or any other suitable type of front gate structure. Although not shown to avoid clutter in the drawings, each front gate finger can further include gate sidewall spacers positioned laterally adjacent to sidewalls thereof to electrically isolate it from the adjacent source/drain regions. Such gate and gate side-wall spacer structures are well known in the art and, thus, the details thereof have been omitted from the specification in order to allow the reader to focus on the salient aspects of the disclosed embodiments.

As mentioned above, for each NFET having multiple front gate fingers (e.g., for at least first NFET 110), the front gate fingers can be electrically connected. For example, as illustrated in FIG. 2B, the electrical connection between all first front gate fingers 115 can be achieved through gate patterning. Specifically, a connecting gate structure 119 (having the same multi-layer configuration as each first front gate finger 115) can be patterned and etched concurrently with the front gate fingers so that it lands on trench isolation region 205 and so that it is perpendicular to and abuts each of the first front gate fingers 115. Alternatively, any other suitable technique for electrically connecting the first front gate fingers 115 could be employed (e.g., a combination of middle of the line (MOL) contacts and back end of the line (BEOL) wiring; etc.).

Optionally, all front gate fingers (including first front gate fingers 115, second front gate finger(s) 125, third front gate finger(s) 135, and any dummy front gate fingers 145) can be essentially parallel and can extend across the full width of active device region 207 (as defined by trench isolation regions 205). They can further be separated by essentially the same distance (i.e., the front gate fingers can have an essentially uniform gate pitch). That is, the separation distances between front gate fingers can be equal (except for minor process variations). Additionally, they can have essentially the same dimensions (including gate finger length as measured from one source/drain region towards another across a channel region, height, etc.). In this case, each first channel region of the multiple first channel regions 113, each second channel region of the one or more second channel regions 123, and each third channel region of the one or more third channel regions 133 will have essentially equal channel lengths (except for minor process variations) as measured between adjacent first source/drain regions 112, adjacent second source/drain regions 122, and adjacent third source/drain regions 132, respectively. As mentioned above, since all gate fingers have the same dimensions, due to the greater number of gate fingers in first NFET 110 as compared to the number(s) of gate fingers in second NFET 120 and third NFET 130, first NFET 110 has a greater total channel width than second NFET 120 and third NFET 130.

It should be noted that within first NFET 110, second NFET 120, and third NFET 130, each channel region can be either an intrinsic channel region (i.e., an undoped channel region) or a P-type channel region with a relatively low conductivity level (i.e., a P-channel region). Each source/drain region can be an N-type source/drain region with a relatively high conductivity level (i.e., an N+ source/drain region). The N-type source/drain region can include a lower portion and, particularly, an N-doped portion of semiconductor layer 204. Optionally, although not shown to avoid clutter in the drawings, the N-type source/drain region can also include an upper or raised portion. The upper portion can be an N-doped monocrystalline semiconductor layer epitaxially grown on the top surface of semiconductor layer 204 above and immediately adjacent to the lower portion.

First NFET 110, second NFET 120, and third NFET 130 can further include a first back gate 116, a second back gate 126 and a third back gate 136, respectively. Specifically, semiconductor substrate 201 can include a well region 202 therein. Well region 202 can be located at the top surface of semiconductor substrate 201 immediately adjacent insulator layer 203 and can further be aligned below the active device region 207 of the NFETs 110, 120, 130. For purposes of this disclosure, a well region refers to a region of semiconductor material doped (e.g., via a dopant implantation process or any other suitable doping process) so as to have a particular conductivity type.

Those skilled in the art will recognize that one advantage of advanced semiconductor-on-insulator technology processing platforms is that FETs can be formed on an insulator layer above either a particular type of well region (e.g., an N-type well region (Nwell) or a P-type well region (Pwell)) in order to achieve different types of NFETs or PFETs with different threshold voltages (VTs). For example, for a super low threshold voltage (SLVT) or low threshold voltage (LVT) FET, an NFET can be formed above an Nwell. For a regular threshold voltage (RVT) or high threshold voltage (HVT) FET, an NFET can be formed above a Pwell and a PFET can be formed above an Nwell. Whether the FETs are SLVT or LVT FETs or whether they are RVT or HVT FETs will depend upon the design (e.g., device size, etc.) and process specifications (e.g., dopant concentrations, etc.). In a CE as disclosed herein, the three transistors could be SLVT or LVT NFETs (i.e., well region 202 could be an Nwell) or RVT or HVT NFETs (i.e., well region 202 could be a Pwell). Another advantage of advanced semiconductor-on-insulator technology processing platforms is that corresponding portions of the insulator layer and well region below each FET effectively forms a back gate, which can be biased (referred to as back gate biasing or back-biasing) to fine tune the threshold voltage. Forward back-biasing (FBB) refers to applying a gate bias voltage to the back gate (particularly, to the well region thereof) to reduce the VT of the FET. Reverse back-biasing (RBB) refers specifically to applying a gate bias voltage to the back gate (particularly, to the well region thereof) to increase the VT of the FET, thereby decreasing the switching speed and reducing leakage current.

Because the same well region 202 is below all three transistors, a first back gate 116 of first NFET 110, a second back gate 126 of second NFET 120 and a third back gate 136 of third NFET 130 are formed from different portions of the same insulator layer and well region and back-biasing can be performed concurrently by biasing well region 202 (as discussed in greater detail below). To facilitate back gate biasing, the structure can further include a bulk region (also referred to as a hybrid region). This bulk region can be devoid of insulator layer 203 and instead can include well contact region 206 (also referred to herein as a well tap) at the top surface of semiconductor substrate 201 immediately adjacent to well region 202, and electrically isolated from the active device region by STI structures. Well contact region 206 can include, for example, an epitaxial monocrystalline semiconductor layer (e.g., an epitaxial silicon layer or an epitaxial layer of any other suitable semiconductor material), which is grown on the top surface of semiconductor substrate 201 immediately adjacent to well region 202 and either in situ doped or subsequently implanted so as to have the same type conductivity but at a higher conductivity level than the well region below. Alternatively, well contact region 206 could be a highly doped region within and at the top surface of well region 202.

It should be understood that the example dual-gated NFETs shown in the CE of FIGS. 2A-2B is just one type of dual-gated NFET that could be incorporated into TC 100. Alternatively, any other type of dual-gated NFETs having biasable front and back gates could be used.

Each CE 101 can further include a pair of capacitors (Cu). Specifically, each CE 101 can include a first capacitor 161 and a second capacitor 162. First capacitor 161 can include a pair of capacitor plates separated by a capacitor dielectric. One capacitor plate can be connected to the first shared source/drain region 122/112 between first NFET 110 and second NFET 120 and the other can be connected to the first voltage line 102. Second capacitor 162 can similarly include a pair of capacitor plates separated by a capacitor dielectric. One capacitor plate can be connected to the second shared source/drain region 112/132 between first NFET 110 and third NFET 130 and the other can be connected to the second voltage line 103. The first and second capacitors 161-162 can be any suitable type of back end of the line (BEOL) capacitor, such as metal-oxide-metal capacitors (MOMCAPs) (e.g., vertical natural capacitors (VNCAPs)), or metal-insulator-metal capacitors (MIMCAPs). Such BEOL capacitors are well known in the art and, thus, the details thereof have been omitted from the specification and the drawings in order to allow the reader to focus on the salient aspect of the disclosed embodiments. In some embodiments, as illustrated in FIGS. 2A-2B, first and second capacitors 161-162 can be within the BEOL metal levels such that they are completely offset from the three transistors below (i.e., first NFET 110, second NFET 120, and third NFET 130) to minimize any parasitic capacitances therebetween. Alternatively, to reduce the amount of chip area consumed by each CE 101, first and second capacitors 161-162 can each partially overlay one or more of the three transistors. In the example CE 101' shown in FIG. 3, first capacitor 161 can overlay second NFET 120 and, optionally, partially overlay first NFET 110, whereas second capacitor 162 can overlay third NFET 130 and, optionally, partially overlay first NFET 110.

It should be noted that, because the drain regions of second NFET 120 and third NFET 130 are shared with first NFET 110, parasitic capacitance is reduced at nodes A (i.e., the connection to first capacitor 161) and B (i.e., the connection to second capacitor 162).

Optionally, a design layout for NFETs 110, 120, and 130 described above and illustrated in FIGS. 2A-2B could be generated by modifying the cell of a single multi-finger NFET. For example, a cell for a multi-finger NFET may include a total number (X) of gate fingers, where X is either fixed or customizable. Some number Y (where $Y \leq X-2$) of the X gate fingers traversing the center portion of the active device region can be assigned to first NFET 110 and any remaining gate fingers traversing the end portions of the active device region 207 can be assigned to second NFET 120 and third NFET 130. Referring again to FIG. 1 in combination with FIG. 2A (or FIG. 3), first front gate (i.e., first front gate fingers 115) as well as first back gate 116, second back gate 126, and third back gate 136 (e.g., via well contact region 206) can be connected to a first control voltage node to receive a first control voltage (VC1). Second front gate (i.e., second front gate finger(s) 125) and third front gate (i.e., third front gate finger(s) 135) can be connected to receive a second control node to receive a second control voltage (VC2).

VC1 and VC2 can be concurrently switchable between high and low voltage levels to concurrently switch the three transistors (i.e., first NFET 110, second NFET 120, and third NFET 130) between on and off states.

FIG. 4 is a table illustrating examples of the high and low voltage levels that could be employed for VC1 and VC2, when the transistors have threshold voltages of, for example, at or below 0.9V. For example, the high voltage level of VC1 can be at a first positive voltage level (VH) (e.g., 0.9V), which is higher than threshold voltages (VTs) of the three transistors. The low voltage level of VC1 can be at VL1 (e.g., at ground or, more particularly, 0.0V). The high voltage level of VC2 can similarly be at VH. However, instead of being at ground, the low voltage level of VC2 can be at a second positive voltage level (VL2), which is lower than VH but higher than VL1 (i.e., above 0.0V). For example, VL2 can be close to or equal to the VTs of the three transistors. In some embodiments, VL2 could be at a sub-VT level or, more particularly, at a voltage level that is slightly less than but close to the VT. When VC1 and VC2 both go high, on resistance (Ron) is low and CE is switched to an on-state with the first and second capacitors 161-162 being shorted to ground. In this case, the differential capacitor between the first and second voltage lines 102-103 will be equal to 0.5*Cu. It should be noted that Ron exhibited by the disclosed CE 101 may be lower than Ron exhibited by conventional CEs and, thus, Qon may be improved (e.g., slightly higher). However, when VC1 and VC2 both go low, first NFET 110 will turn completely off because VC1 is at ground but the second and third NFETs 120 and 130 will be biased using VL2 (e.g., in the sub-VT region) to provide high off-resistance (Roff) impedance when CE is in the off-state.

Figure 3:
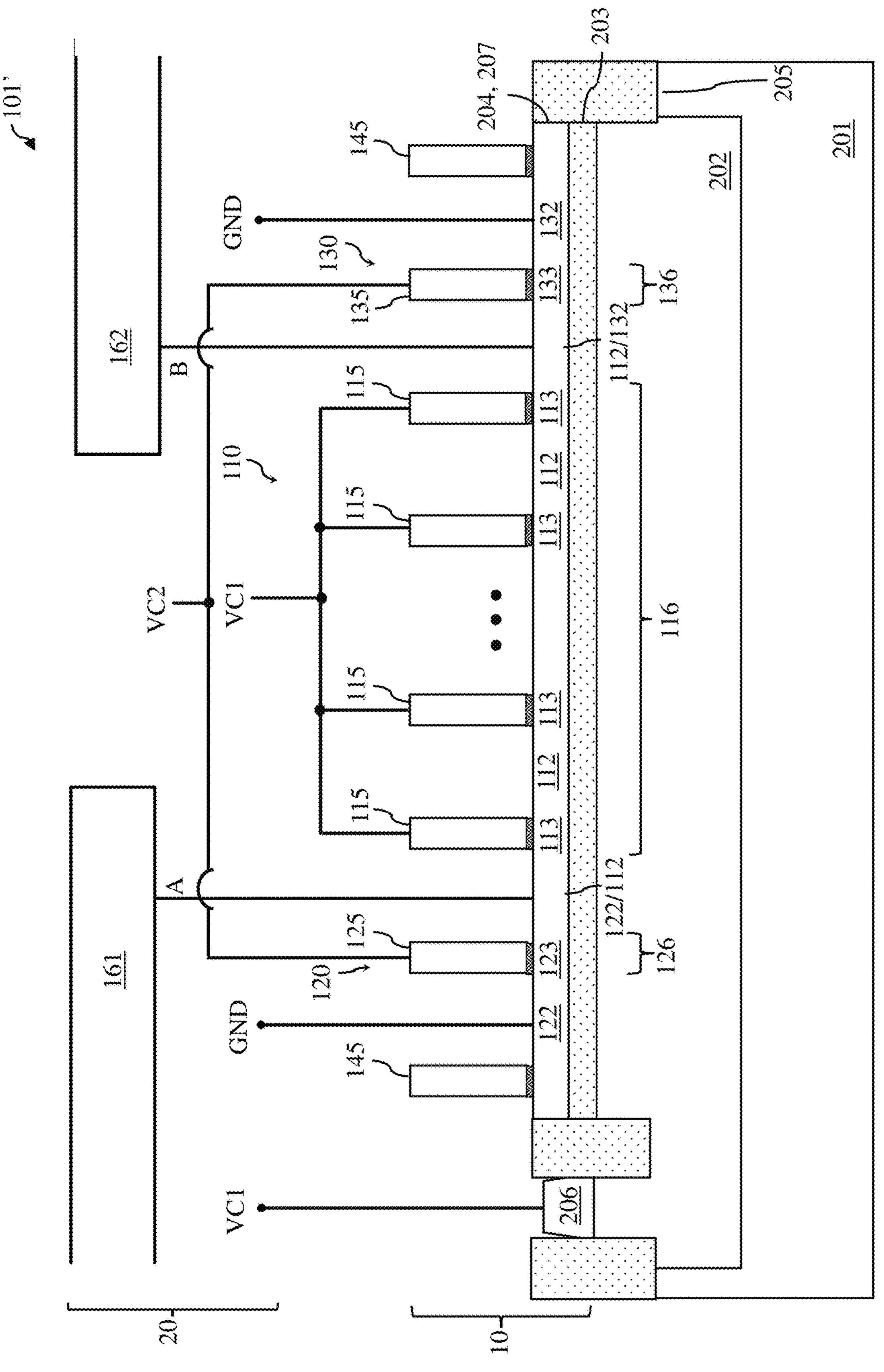
FIG. 3 is a cross-section diagram illustrating, in greater detail, another embodiment of the CE of FIG. 1.

FIG. 5 is a table illustrating examples of various performance values including on-state capacitance (Con), off-state capacitance (Coff), tuning ratio, on-state Q (Qon), and off state Q (Qoff), which can be achieved with a currently available CE, with CE 101 of FIGS. 2A-2B, and with CE 101' of FIG. 3. Con can be, for example, close in value to the capacitance of the capacitors 161, 162. It should be noted that, as compared to the currently available CE, CEs 101 and 101' are relatively compact, exhibit a similar or negligibly smaller Con, exhibit a lower Coff, have a higher tuning ratio (i.e., Con/Coff), and have a higher on-state Q (Qon). As illustrated, while the Qoff may be lower, those skilled in the art will recognize that as long as Qoff is significantly greater than Qon (e.g., two or more times Qon), the lower value of Qoff may not be critical.

Referring again to FIG. 1, TC 100 can further include additional circuitry to enable selective programming of each CE $\mathbf{101}_{0-n}$ so that it is either in the on-state or the off-state, as discussed above. Specifically, this additional circuitry can include an input node for receiving (e.g., from a controller) a digital-to-analog converter (DAC) code with n+1 bits (i.e., DAC_Code <n:0>). Each bit within the DAC code can correspond to a different one of the CEs $\mathbf{101}_{0-n}$ in TC 100. The additional circuitry can further include an inverter configured to invert DAC_Code <n:0>. The additional circuitry can further include control voltage circuitry $\mathbf{190}_{0-n}$ for each CE $\mathbf{101}_{0-n}$. The control voltage circuitry for each CE can include a first voltage supply 191 for supplying VC1 to the CE and a second voltage supply 192 for supply VC2 to the CE.

FIG. 6.1 is a schematic diagram illustrating an example of a first voltage supply 191. First voltage supply 191 can be connected to receive a switch control signal (DO) and an inverted switch control signal (DOb). First voltage supply 191 can further include a first pair of digitally-controlled switches 611-612, which, in response to DO and DOb, selectively connect a first control voltage node 619 to either a positive supply voltage rail 698 at VH or to the ground rail

199 (e.g., at VL1 or, more particularly, 0.0V). In some embodiments, the first pair of digitally-controlled switches could be NFETs with DO and DOb being applied to the gates of the NFETs, respectively. Thus, when DO is high and DOb is low, the first control voltage node receives VH; whereas, when DO is low and DOb is high, the first control voltage node is pulled to ground. Alternatively, any other suitable types of digitally-controlled switches could be employed.

FIG. 6.2 is a schematic diagram illustrating an example of a second voltage supply 192. Second voltage supply 192 can also be connected to receive a switch control signal (DO) and an inverted switch control signal (DOb). Second voltage supply 192 can include a reference current source 630 and an additional transistor 620 connected in series between the reference current source 630 and the ground rail 199. The additional transistor 620 can be an NFET (hereinafter referred to as additional NFET 620). Additional NFET 620 can be a dual-gate NFET and can be relatively large compared to first NFET 110, second NFET 120, and third NFET 130. For example, additional NFET 620 can be at least three (3) times larger or more (e.g., 3-4 times larger, 5 times larger, up to 10 times larger) than each of the NFETs 110, 120, and 130 to ensure that Qoff meets required specifications. In any case, this additional NFET 620 can include a channel region 623 positioned between source/drain regions 621-622 and front and back gates 625-626 adjacent to opposite surfaces of the channel region 623. Back gate 626 can be connected to the source region 621 and front gate 625 can be connected to the drain region 622. Second voltage supply 192 can further include: a second control voltage node 629 and a second pair of digitally-controlled switches 641-642, which, in response to signals DO and DOb, selectively connect second control voltage node 629 to either the positive supply voltage rail 698 at VH or to drain region 622 of additional NFET 620 to receive VL2. In some embodiments, the second pair of digitally-controlled switches could be NFETs with DO and DOb being applied to the gates of the NFETs, respectively. Thus, when DO is high and DOb is low, the second control voltage node receives VH; whereas, when DO is low and DOb is high, the second control voltage node receives VL2. Alternatively, any other suitable types of digitally-controlled switches could be employed.

It should be understood that in the method and structures described above, a semiconductor material refers to a material whose conducting properties can be altered by doping with an impurity. Exemplary semiconductor materials include, for example, silicon-based semiconductor materials (e.g., silicon, silicon germanium, silicon germanium carbide, silicon carbide, etc.) and III-V compound semiconductors (i.e., compounds obtained by combining group III elements, such as aluminum (Al), gallium (Ga), or indium (In), with group V elements, such as nitrogen (N), phosphorous (P), arsenic (As) or antimony (Sb)) (e.g., GaN, InP, GaAs, or GaP). A pure semiconductor material and, more particularly, a semiconductor material that is not doped with an impurity for the purposes of increasing conductivity (i.e., an undoped semiconductor material) is referred to in the art as an intrinsic semiconductor. A semiconductor material that is doped with an impurity for the purposes of increasing conductivity (i.e., a doped semiconductor material) is referred to in the art as an extrinsic semiconductor and will be more conductive than an intrinsic semiconductor made of the same base material. That is, extrinsic silicon will be more conductive than intrinsic silicon; extrinsic silicon germanium will be more conductive than intrinsic silicon germanium; and so on. Furthermore, it should be understood that different impurities (i.e., different dopants) can be used to achieve different conductivity types (e.g., P-type conductivity and N-type conductivity) and that the dopants may vary depending upon the different semiconductor materials used. For example, a silicon-based semiconductor material (e.g., silicon, silicon germanium, etc.) is typically doped with a Group III dopant, such as boron (B) or indium (In), to achieve P-type conductivity, whereas a silicon-based semiconductor material is typically doped with a Group V dopant, such as arsenic (As), phosphorous (P) or antimony (Sb), to achieve N-type conductivity. A gallium nitride (GaN)-based semiconductor material is typically doped with magnesium (Mg) to achieve P-type conductivity and with silicon (Si) or oxygen to achieve N-type conductivity. Those skilled in the art will also recognize that different conductivity levels will depend upon the relative concentration levels of the dopant(s) in a given semiconductor region.

It should be understood that the terminology used herein is for the purpose of describing the disclosed structures and methods and is not intended to be limiting. For example, as used herein, the singular forms “a,” “an,” and “the” are intended to include the plural forms as well, unless the context clearly indicates otherwise. Additionally, as used herein, the terms “comprises,” “comprising,” “includes,” and/or “including” specify the presence of stated features, integers, steps, operations, elements, and/or components, but do not preclude the presence or addition of one or more other features, integers, steps, operations, elements, components, and/or groups thereof. Furthermore, as used herein, terms such as “right,” “left,” “vertical,” “horizontal,” “top,” “bottom,” “upper,” “lower,” “under,” “below,” “underlying,” “over,” “overlying,” “parallel,” “perpendicular,” etc., are intended to describe relative locations as they are oriented and illustrated in the drawings (unless otherwise indicated) and terms such as “touching,” “in direct contact,” “abutting,” “directly adjacent to,” “immediately adjacent to,” etc., are intended to indicate that at least one element physically contacts another element (without other elements separating the described elements). The term “laterally” is used herein to describe the relative locations of elements and, more particularly, to indicate that an element is positioned to the side of another element as opposed to above or below the other element, as those elements are oriented and illustrated in the drawings. For example, an element that is positioned laterally adjacent to another element will be beside the other element, an element that is positioned laterally immediately adjacent to another element will be directly beside the other element, and an element that laterally surrounds another element will be adjacent to and border the outer sidewalls of the other element. The corresponding structures, materials, acts, and equivalents of all means or step plus function elements in the claims below are intended to include any structure, material, or act for performing the function in combination with other claimed elements as specifically claimed.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various disclosed embodiments have been presented for purposes of illustration but are not intended to be exhaustive or limiting. Many modifications and variations will be apparent to those of ordinary skill in the art without departing from the scope and spirit of the disclosed embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A structure comprising:

three transistors including:

a first transistor with a first front gate and a first back gate;

a second transistor with a second front gate and a second back gate; and a third transistor with a third front gate and a third back gate, wherein the first transistor is connected in series between the second transistor and the third transistor, wherein the first front gate, the first back gate, the second back gate, and the third back gate are connected to receive a first control voltage switchable between a first positive voltage level and 0.0 volts, and wherein the second front gate and the third front gate are connected to receive a second control voltage that is switchable between the first positive voltage level and a second positive voltage level different from the first positive voltage level;

a first capacitor connected to a first shared source/drain region between the first transistor and the second transistor; and a second capacitor connected to a second shared source/drain region between the first transistor and the third transistor.

2. The structure of claim 1, wherein the second transistor is connected between a ground rail and the first transistor and the third transistor is connected between the first transistor and the ground rail.

3. The structure of claim 1, wherein the first transistor has a larger total channel width than the second transistor and a larger total channel width than the third transistor.

4. The structure of claim 3, wherein the first front gate has multiple first gate fingers, the second front gate has a single second gate finger, and the third front gate has a single third gate finger, and wherein the multiple first gate fingers, the single second gate finger, and the single third gate finger have equal dimensions.

5. The structure of claim 1, wherein the first capacitor includes first capacitor plates connected to the first shared source/drain region and a first voltage line, respectively, and wherein the second capacitor includes second capacitor plates connected to the second shared source/drain region and a second voltage line, respectively.

6. The structure of claim 1, wherein the three transistors are N-type field effect transistors, wherein the first control voltage and the second control voltage are concurrently switchable between high and low voltage levels to concurrently switch the three transistors between on and off states, wherein the high and low voltage levels of the first control voltage are the first positive voltage level and 0.0V, respectively, wherein the first positive voltage level is higher than threshold voltages of any of the three transistors, wherein the high and low voltage levels of the second control voltage are at the first positive voltage level and the second positive voltage level, respectively, and wherein the second positive voltage level is lower than the first positive voltage level and higher than 0.0V.

7. The structure of claim 6, further comprising:

a first control voltage node connected to receive the first control voltage from a first voltage supply; and a second control voltage node connected to receive the second control voltage from a second voltage supply, wherein the first voltage supply includes a first pair of digitally-controlled switches that selectively connect the first control voltage node to one of a positive supply voltage rail at a first positive voltage level that is higher than threshold voltages of the three transistors and a ground rail, and wherein the second voltage supply includes:

a reference current source;

an additional transistor connected in series between the reference current source and the ground rail, wherein the additional transistor is at least three times larger than each of the three transistors and wherein a gate and a drain region of the additional transistor are electrically connected; and a second pair of digitally-controlled switches that selectively connect the second control voltage node to one of the positive supply voltage rail at the first positive voltage level and the drain region of the additional transistor at a second positive voltage level that is lower than the first positive voltage level and higher than 0.0 volts.

8. The structure of claim 1, further comprising:

a semiconductor substrate;

a well region in the semiconductor substrate;

an insulator layer on the semiconductor substrate;

an active device region on the insulator layer, wherein the active device region includes device regions for the three transistors and wherein the first back gate, the second back gate, and the third back gate include corresponding portions of the insulator layer and the well region aligned below the active device region; and a well tap adjacent to the well region and isolated from the active device region, wherein the well tap is connected to receive the first control voltage.

9. The structure of claim 1, wherein the first capacitor and the second capacitor are any of metal-oxide-metal capacitors and metal-insulator-metal capacitors and wherein the first capacitor and the second capacitor are completely offset from the three transistors.

10. The structure of claim 1, wherein the first capacitor and the second capacitor are any of metal-oxide-metal capacitors and metal-insulator-metal capacitors at least partially overlaying at least the second transistor and the third transistor.

11. A structure comprising:

a first voltage line;

a second voltage line; and a capacitive element, wherein the capacitive element includes:

three transistors including:

a first transistor with a first front gate and a first back gate;

a second transistor with a second front gate and a second back gate; and a third transistor with a third front gate and a third back gate, wherein the first transistor is connected in series between the second transistor and the third transistor with the second transistor being connected between a ground rail and the first transistor and the third transistor being connected between the first transistor and the ground rail, wherein the first front gate, the first back gate, the second back gate and the third back gate are connected to receive a first control voltage switchable between a first positive voltage level and 0.0 volts, and wherein the second front gate and the third front gate are connected to receive a second control voltage that is switchable between the first positive voltage level and a second positive voltage level different from the first positive voltage level;

a first capacitor connected between the first voltage line and a first shared source/drain region between the first transistor and the second transistor; and a second capacitor connected between the second voltage line and a second shared source/drain region between the first transistor and the third transistor.

12. The structure of claim 11, wherein the first transistor has a larger total channel width than the second transistor and a larger total channel width than the third transistor.

13. The structure of claim 12, wherein the first front gate has multiple first gate fingers, the second front gate has a single second gate finger, and the third front gate has a single third gate finger, and wherein the multiple first gate fingers, the single second gate finger, and the single third gate finger have equal dimensions.

14. The structure of claim 11, wherein the first capacitor includes first capacitor plates connected to the first shared source/drain region and the first voltage line, respectively, and wherein the second capacitor includes second capacitor plates connected to the second shared source/drain region and the second voltage line, respectively.

15. The structure of claim 11, wherein the three transistors are N-type field effect transistors, and wherein the first control voltage and the second control voltage are concurrently switchable between high and low voltage levels to concurrently switch the three transistors between on and off states.

16. The structure of claim 15, further comprising:

a first control voltage node connected to receive the first control voltage from a first voltage supply; and a second control voltage node connected to receive the second control voltage from a second voltage supply, wherein the first voltage supply includes a first pair of digitally-controlled switches that selectively connect the first control voltage node to one of a positive supply voltage rail at the first positive voltage level that is higher than threshold voltages of the three transistors and the ground rail, and wherein the second voltage supply includes:

a reference current source;

an additional transistor connected in series between the reference current source and the ground rail, wherein the additional transistor is at least three times larger than any of the three transistors and wherein a gate and a drain region of the additional transistor are electrically connected; and a second pair of digitally-controlled switches that selectively connect the second control voltage node to one of the positive supply voltage rail at the first positive voltage level and the drain region of the additional transistor at the second positive voltage level that is lower than the first positive voltage level and higher than 0.0 volts.

17. The structure of claim 11, further comprising:

a semiconductor substrate;

a well region in the semiconductor substrate;

an insulator layer on the semiconductor substrate;

an active device region on the insulator layer, wherein the active device region includes device regions for the three transistors and wherein the first back gate, the second back gate, and the third back gate include corresponding portions of the insulator layer and the well region aligned below the active device region; and a well tap adjacent to the well region and isolated from the active device region, wherein the well tap is connected to receive the first control voltage.

18. The structure of claim 11, wherein the first capacitor and the second capacitor are any of metal-oxide-metal capacitors and metal-insulator-metal capacitors and wherein the first capacitor and the second capacitor are completely offset from the three transistors.

19. The structure of claim 11, wherein the first capacitor and the second capacitor are any of metal-oxide-metal capacitors and metal-insulator-metal capacitors at least partially overlaying at least the second transistor and the third transistor.

20. A structure comprising:

a first voltage line;

a second voltage line;

multiple capacitive elements connected in parallel between the first voltage line and the second voltage line, wherein each capacitive element includes:

three transistors including:

a first transistor with a first front gate and a first back gate;

a second transistor with a second front gate and a second back gate; and a third transistor with a third front gate and a third back gate, wherein the first transistor is connected in series between the second transistor and the third transistor with the second transistor being connected between a ground rail and the first transistor and the third transistor being connected between the first transistor and the ground rail, wherein the first front gate, the first back gate, the second back gate and the third back gate of the capacitive element are connected to receive a first control voltage switchable between a first positive voltage level and 0.0 volts, and wherein the second front gate and the third front gate of the capacitive element are connected to receive a second control voltage that is switchable between the first positive voltage level and a second positive voltage level different from the first positive voltage level;

a first capacitor connected between the first voltage line and a first shared source/drain region between the first transistor and the second transistor; and a second capacitor connected between the second voltage line and a second shared source/drain region between the first transistor and the third transistor.

* * * * *